United States Patent
Hirata et al.

(10) Patent No.: US 6,215,192 B1
(45) Date of Patent: *Apr. 10, 2001

(54) INTEGRATED CIRCUIT PACKAGE AND INTEGRATED CIRCUIT PACKAGE CONTROL SYSTEM

(75) Inventors: Takashi Hirata, Neyagawa; Hironori Akamatsu, Hirakata, both of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,211

(22) Filed: Jun. 10, 1998

(30) Foreign Application Priority Data

Jun. 12, 1997 (JP) .................................... 9-155314

(51) Int. Cl.⁷ .......................... H01L 23/48; H01L 23/52; H01L 29/40
(52) U.S. Cl. .......................... 257/777; 257/723; 257/724; 257/686
(58) Field of Search .................................... 257/777, 723, 257/724, 685, 686, 692, 693, 778, 786

(56) References Cited

U.S. PATENT DOCUMENTS

| | | | |
|---|---|---|---|
| 4,893,174 | * | 1/1990 | Yamada et al. . |
| 5,245,216 | * | 9/1993 | Sako . |
| 5,281,852 | * | 1/1994 | Normington . |
| 5,343,366 | * | 8/1994 | Cipolla et al. . |
| 5,396,102 | * | 3/1995 | Toshio et al. . |
| 5,408,129 | | 4/1995 | Farmwald et al. .................... 257/692 |
| 5,481,133 | * | 1/1996 | Hsu . |
| 5,604,377 | * | 2/1997 | Palagonia . |
| 5,708,297 | * | 1/1998 | Clayton . |
| 5,780,925 | * | 7/1998 | Cipolla et al. . |
| 5,790,380 | * | 8/1998 | Fankeny . |

FOREIGN PATENT DOCUMENTS

| | | |
|---|---|---|
| 63-056950 | 3/1988 | (JP) . |
| 10-162688 | 6/1992 | (JP) . |
| 5-347375 | 12/1993 | (JP) . |
| 9-036300 | 2/1997 | (JP) . |

OTHER PUBLICATIONS

Office Action from Japanese Patent Office mailed Mar. 15, 1999, concerning corresponding Japanese application.

* cited by examiner

Primary Examiner—Sheila V. Clark
(74) Attorney, Agent, or Firm—Renner, Otto, Boisselle & Sklar, LLP

(57) ABSTRACT

The integrated circuit package of this invention includes a first integrated circuit chip and a second integrated circuit chip having a same function, wherein the first integrated circuit chip and the second integrated circuit chip are connected to a common bus.

12 Claims, 12 Drawing Sheets

At data transmission

At data receiving

SHP (Prior art)

INTEGRATED CIRCUIT PACKAGE AND INTEGRATED CIRCUIT PACKAGE CONTROL SYSTEM

BACKGROUND OF THE INVENTION

1. Field of the Invention

The present invention relates to an integrated circuit package disposed on a bus formed on a printed board, and a system including such an integrated circuit package.

2. Description of the Related Art

With the recent improvement in the speed of data transfer between LSIs (large scale integrated circuits), problems such as (1) skewing between data and clocks and (2) disturbance of transfer data and a clock waveform due to noise and the like arise. In order to solve these problems, it is necessary to make uniform and short the lengths of buses running on a printed board between a controller and an LSI which exchanges data with the controller, i.e., the distances between the controller and the LSI. The "distance" as used herein refers to the length of a signal path.

At high-speed data transfer, in order to avoid the above problems, the distances from connection pads (hereinbelow, simply referred to as "pads") to lead pins (hereinbelow, simply referred to as "pins") via bonding wires (hereinbelow, simply referred to as "wires") are required to be equal to one another due to the following reasons.

FIGS. 16A and 16B exemplify timings at data transmission and data receiving, respectively, in the data transfer between LSIs disposed on a bus formed on a printed board. In this example, it is assumed that a transmitter LSI transmits data D1 and D2 at a timing T1 (FIG. 16A), and a receiver LSI receives the data D1 and D2 at a timing T2 (FIG. 16B).

The transmitted data D1 and D2 are transferred to the receiver LSI via corresponding pads, wires, and pins in the LSI package, as well as via the buses on the printed board. At this data transfer, if the lengths of the signal paths for these data are different from each other, the arrival times of the data are different from each other. If the difference in the data arrival time is equal to or exceeds a half of a clock period T, i.e., T/2, then data D1 and D2 are no longer received simultaneously at the timing T2. As a result, simultaneous time transfer of a plurality of data is not possible.

For the high-speed data transfer between LSIs, it is desirable to increase a clock frequency, which determines the timings of data receiving and data transmission. As the clock frequency becomes higher, the clock period T shown in FIGS. 16A and 16B becomes shorter. As a result, the difference in the data arrival time due to the different lengths of the signal paths described above becomes a serious problem. Accordingly, in order to realize high-speed data transfer, it is necessary to provide signal paths with equal lengths for respective data. The lengths of the pins and wires should also be made equal to one another.

A technique for solving the above problems is disclosed in U.S. Pat. No. 5,408,129, where, as shown in FIG. 17, equal distances from pins to corresponding pads formed on an integrated circuit board are realized by extending the pins only from one side of a package.

It is also required to reduce the length of each bus running from a controller on a printed board as described above. In order to avoid the above-described problems, the bus length should not exceed a predetermined limit. An integrated circuit should therefore be disposed on the bus within the predetermined bus length limit.

However, such a package that has pins extending only from one side thereof produces dead spaces as shown in FIG. 18. FIG. 18 is a plan view schematically showing surface horizontal packages (SHP) disposed on a bus. The dead space as used herein refers to an area obtained by excluding an area corresponding to a length $d_1$ or $d_2$ of a function block on an integrated circuit chip in the bus direction from the area occupied by the integrated circuit package. The area corresponding to the length $d_1$ of the function block in the bus direction refers to an area $Sd_1$ shown by sinking slanted lines in FIG. 18. Hereinbelow, an area corresponding to a given length in the bus direction refers to an area having the same relationship therewith as that between the length $d_1$ and the area $Sd_1$. For example, the area corresponding to a length $a_1$ in the bus direction is an area $Sa_1$ shown by rising slanted lines in FIG. 18.

In FIG. 18, the areas corresponding to lengths $a_1$, $b_1$, $c_1$, $e_1$, $a_2$, $b_2$, $c_2$ constitute dead spaces. These dead spaces can be reduced, so that the bus length of the predetermined limit described above can be more effectively utilized.

SUMMARY OF THE INVENTION

The integrated circuit package of this invention includes a first integrated circuit chip and a second integrated circuit chip having a same function, wherein the first integrated circuit chip and the second integrated circuit chip are connected to a common bus.

In one embodiment of the invention, the first integrated circuit chip and the second integrated circuit chip are memory chips.

In another embodiment of the invention, the first integrated circuit chip and the second integrated circuit chip are disposed so that the first integrated circuit chip and the second integrated circuit chip are adjacent to each other in a plane.

In still another embodiment of the invention, the first integrated circuit chip and the second integrated circuit chip are disposed so that the first integrated circuit chip and the second integrated circuit chip overlap each other.

In still another embodiment of the invention, the first integrated circuit chip and the second integrated circuit chip are disposed so that one of the first integrated circuit chip and the second integrated circuit chip is placed face down with respect to the other.

In still another embodiment of the invention, the first integrated circuit chip includes a plurality of first pins connected to the common bus and a plurality of first pads connected to the plurality of first pins, and distances between points at which the first pins are connected to the common bus and the first pads to which the first pins are connected are substantially equal to one another.

According to another aspect of the invention, a system including an integrated circuit package and a control circuit for controlling the integrated circuit package is provided. In the system, the integrated circuit package includes a first integrated circuit chip and a second integrated circuit chip having a same function, and the first integrated circuit chip, the second integrated circuit chip, and the control circuit are connected to a common bus.

In one embodiment of the invention, the first integrated circuit chip and the second integrated circuit chip are memory chips.

In another embodiment of the invention, the first integrated circuit chip and the second integrated circuit chip are disposed so that the first integrated circuit chip and the second integrated circuit chip are adjacent to each other in a plane.

In still another embodiment of the invention, the first integrated circuit chip and the second integrated circuit chip are disposed so that the first integrated circuit chip and the second integrated circuit chip overlap each other.

In still another embodiment of the invention, the first integrated circuit chip and the second integrated circuit chip are disposed so that one of the first integrated circuit chip and the second integrated circuit chip is placed face down with respect to the other.

In still another embodiment of the invention, the first integrated circuit chip includes a plurality of first pins connected to the common bus and a plurality of first pads connected to the plurality of first pins, and distances between points at which the first pins are connected to the common bus and the first pads to which the first pins are connected are substantially equal to one another.

Thus, the invention described herein makes possible the advantages of (1) providing an integrated circuit package where integrated circuit chips can be disposed with a higher density within the range of a predetermined bus length limit, and (2) providing a system including such an integrated circuit package.

These and other advantages of the present invention will become apparent to those skilled in the art upon reading and understanding the following detailed description with reference to the accompanying figures.

DESCRIPTION OF THE PREFERRED EMBODIMENTS

Figure 1:
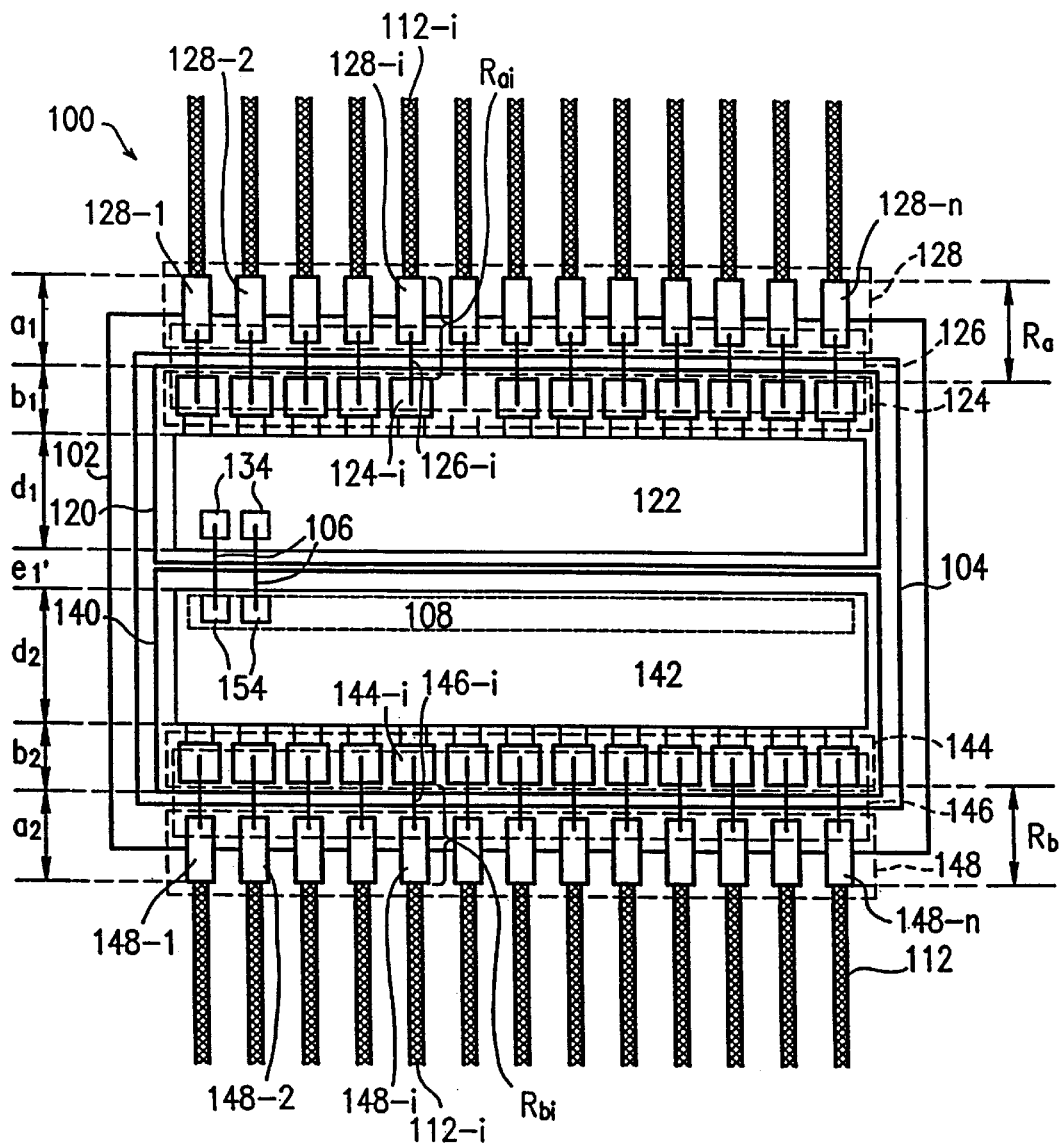
FIG. 1 is a plan view schematically illustrating the inner construction of an integrated circuit package of Example 1 according to the present invention.

The integrated circuit package according to the present invention will be described by way of example with reference to the accompanying drawings. Throughout the drawings, the same components are denoted by the same reference numerals. Components denoted by reference numerals in which the last two digits are identical are similar to each other. Each of the plan views and side views illustrating the integrated circuit packages according to the present invention is a view observed through a mold for the package, to reveal the inner construction of the package.

EXAMPLE 1

An integrated circuit package of Example 1 according to the present invention will be described with reference to FIGS. 1 and 2. In this example, two chips are arranged side by side.

Figure 2:
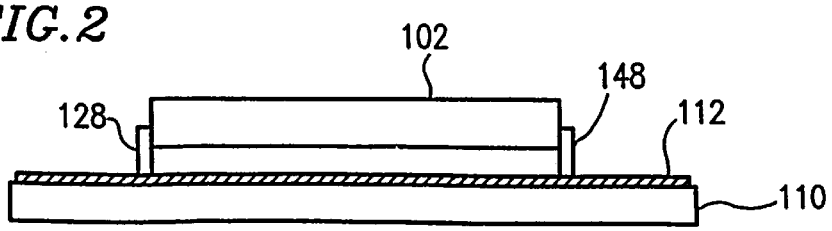
FIG. 2 is a side view schematically illustrating the integrated circuit package of Example 1 when it is disposed on a bus.

FIGS. 1 and 2 are plan and side views, respectively, illustrating an integrated circuit package 100 of this example in the state where it is connected to a bus 112 formed on a printed board 110.

The integrated circuit package 100 includes a substrate 104 formed on a mold 102 for the package. Two integrated circuit chips 120 and 140 are disposed on the substrate 104 so as to be adjacent to each other as shown in FIG. 1. The chips 120 and 140 respectively include independent function blocks 122 and 142 on the sides thereof adjacent to each other. The "independent" function blocks as used herein refer to function blocks which have different input and output signals from each other.

In this example, it is assumed that the chips 120 and 140 have the same functions. For example, the chips 120 and 140 are memory chips. Respective pads of the chips 120 and 140, which receive the same types of signals, are disposed so that they are symmetrical to each other with respect to the sides of the chips 120 and 140 adjacent to each other in the state where they are oriented upward (i.e., they do not face the mold 102). This means that the chips 120 and 140 are not identical to each other in the construction.

The chip 120 has a pad array 124 on the side thereof opposite to the side adjacent to the chip 140. The pad array 124 includes a plurality of pads 124-$i$ ($1 \leq i \leq n$: n is the number of pads) arranged substantially linearly. Each of the pads 124-$i$ is connected to the function block 122 at a predetermined position. The "connection" as used herein refers to electrical connection.

A pin array 128 is disposed on the side of the mold 102 closer to the pad array 124. The pin array 128 includes a plurality of pins 128-$i$ ($1 \leq i \leq n$) arranged substantially linearly.

The pad array 124 and the pin array 128 are disposed substantially in parallel with each other. Accordingly, the distances between all the pads 124-i of the pad array 124 and the corresponding pins 128-i of the pin array 128 are substantially equal to one another. The respective pins 128-i are connected to the corresponding pads 124-i via wires 126-i ($1 \leq i \leq n$). The pins 128-i are also connected to respective signal lines 112-i ($1 \leq i \leq n$) of the bus 112.

The wires 126-i of a wire array 126 are interconnections connecting the corresponding pads 124-i and pins 128-i.

In this example, distances $R_{a1}$ from the pads 124-i connected to the function block 122 at the predetermined positions to the corresponding signal lines 112-i via the pins 128-i are made substantially uniform. Accordingly, the path lengths of the signal lines become equal to one another, and thus skewing between signals on the signal lines is reduced.

As a result, the lengths of the signal paths extending from the pads 124-i to another integrated circuit or the like via the signal lines 112-i of the bus 112 can also be made substantially equal to one another for $i=1, 2, 3, \ldots, n$. Accordingly, the path lengths of signals on the signal lines reaching another integrated circuit or the like become equal to one another, and thus skewing between the signals on the signal lines is reduced.

The pads 124-i are made of a metal having a sufficiently low conductivity, preferably aluminum. The size of the pads 124-i is about 80 to about 120 $\mu m^2$. A smaller size is more preferable.

The pins 128i are preferably made of copper or a 4-2 alloy (an alloy with a ratio of nickel to iron of 4:2). Copper is more preferable. The size of the pins 128-i is preferably about 120 $\mu m$ wide×about 2 to about 3 mm long. A larger width and a smaller length are more preferable.

The wires 128-i are preferably made of gold or aluminum. Gold is more preferable. The size of the wires 128-i is preferably about 1 to about 4 mm long, more preferably about 1 to about 2 mm long. A smaller size is more preferable.

The above materials and sizes of the pads, pins, and wires are applicable to all pads, pins, and wires used in the integrated circuit packages according to the present invention.

The chip 140 has a pad array 144 on the side thereof opposite to the side adjacent to the chip 120. The pad array 144 includes a plurality of pads 144-i ($1 \leq i \leq n$) arranged substantially linearly. Each of the pads 144-i is connected to the function block 142 at a predetermined position.

A pin array 148 is disposed on the side of the mold 102 closer to the pad array 144. The pin array 148 includes a plurality of pins 148-i ($1 \leq i \leq n$) arranged substantially linearly. The pad array 144 and the pin array 148 are disposed substantially in parallel with each other. The respective pins 148-i are connected to the corresponding pads 144-i via wires 146-i ($1 \leq i \leq n$). The distances between all the respective pads 144-i and the corresponding pins 148-i are substantially equal to each other. The pins 148-i are connected to the respective signal lines 112-i ($1 \leq i \leq n$) of the bus 112.

As in the chip 120, distances $R_{b1}$ from the pads 144-i connected to the function block 142 at the predetermined positions to the signal lines 112-i of the bus 112 via the corresponding pins 148-i are substantially uniform. Accordingly, the path lengths of the signal lines become equal to one another, and thus skewing between signals on the signal lines is reduced.

As a result, the lengths of the signal paths extending from the pads 144-i to another integrated circuit or the like via the signal lines 112-i of the bus 112 can also be made substantially equal to one another for $i=1, 2, 3, \ldots, n$. Accordingly, the path lengths of signals on the signal lines reaching another integrated circuit or the like become equal to one another, and thus skewing between signals on the signal lines is reduced. By realizing the equal signal path length for the chip 140 simultaneously with the realization of the equal signal path length from the pads 124-i of the chip 120 to another integrated circuit or the like described above, skewing between signals can be reduced for the two function blocks simultaneously.

As described above, the arrangements of the signal lines for the chips 120 and 140 including the pin arrays are symmetrical to each other with respect to the sides of the chips 120 and 140 adjacent to each other. The pins 128-i and the pins 148-i are substantially in parallel with each other. Thus, as shown in FIG. 1, the chips 120 and 140 can be connected to the common bus 112 which run in parallel with the pins 128-i and 148-i. At the connection, the distances $R_{a1}$ and $R_{b1}$ can be made equal to each other for $i=1, 2, 3, \ldots, n$.

More specifically, it is assumed that the signal lines 112-i of the bus 112 are assigned as a power source line, a grounding line, a command signal line, a first clock signal line, a second clock signal line, a bus control line, a bus enable line, and data signal lines (for the rest of the lines) from left to light as is viewed from FIG. 1. In this case, the pin 128-1 of the chip 120 and the pin 148-1 of the chip 140 are connected to the same power source line. The pin 128-2 of the chip 120 and the pin 148-2 of the chip 140 are connected to the same grounding line. This is applied for the rest of the pins, and finally, the pin 128-n of the chip 120 and the pin 148-n of the chip 140 are connected to the same data signal line.

The connection between each pin of the pin array and the corresponding signal line of the bus which is in parallel with the pin is realized by reducing the width of each signal line 112-i, as well as the pitch of the signal lines 112-i of the bus 112, to match the pitch of the signal lines 112-i with the pitch of the pads 124-i of the pad array 124. The connection between the pins and the corresponding signal lines which are in parallel with the pins in subsequent examples according to the present invention can also be realized in the manner described above.

Figure 18:
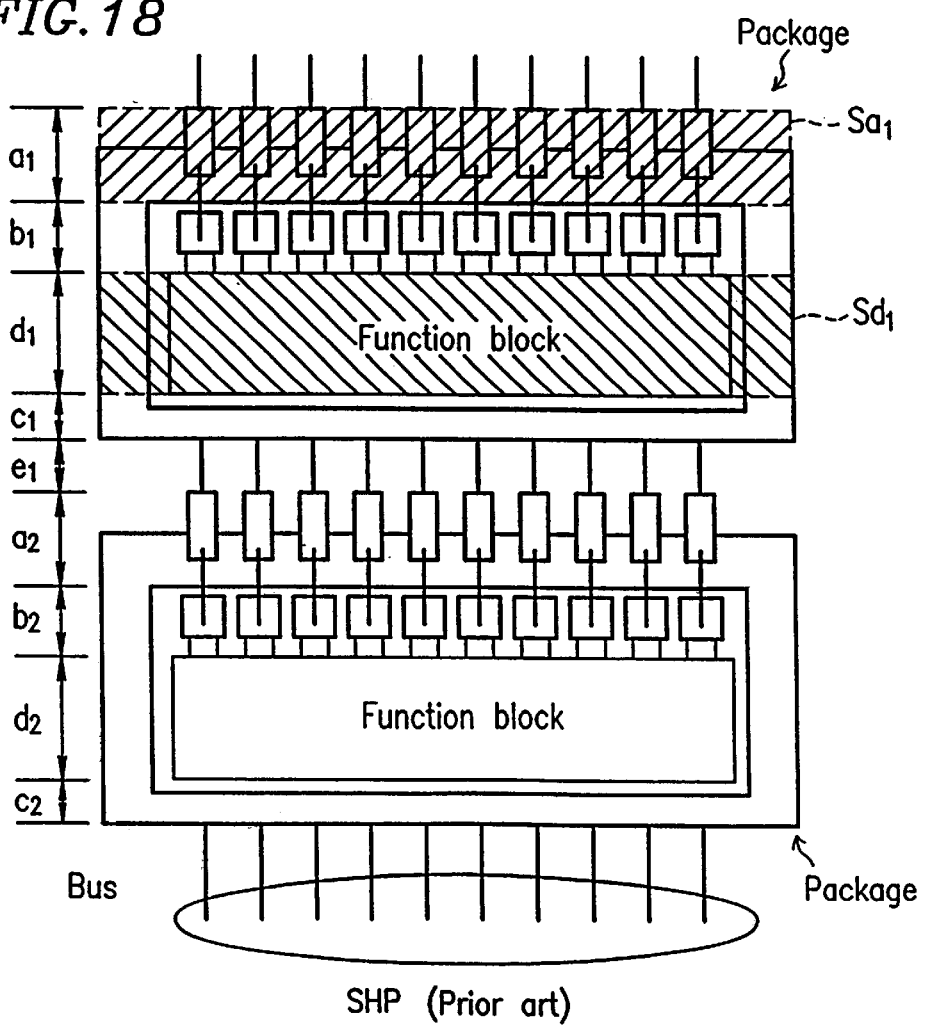
FIG. 18 is a plan view of the conventional integrated circuit packages disposed on a bus.

In the construction shown in FIG. 1, the areas corresponding to lengths $a_1$, $b_1$, $e_1'$, $a_2$, $b_2$ constitute dead spaces. In comparison with the conventional case shown in FIG. 18, the areas corresponding to the lengths $c_1$ and $c_2$ are eliminated from the dead spaces. Moreover, the length $e_1$ is reduced to the length $e_1'$, reducing the dead spaces by the area corresponding to the reduction of the length. The area obtained by the reduction of the dead spaces can be used for providing another integrated circuit. Thus, the chip area which can be disposed on the bus increases. This makes it possible to implement the integrated circuit package 100 with a high density within the range of a limited bus length.

Alternatively, pads 134 and 154 disposed on the function blocks 122 and 142, respectively, may be connected to each other via wires 106, so that a circuit portion 108 can be shared by the chips 120 and 140. Examples of such a circuit portion 108 which can be shared include a power source circuit (a booster circuit, a step-down circuit, etc.) and a synchronization circuit (a phase locked loop (PLL) circuit, a delay locked loop (DLL) circuit, etc.). With this alternative construction, the lengths $d_1$ and $d_2$ of the function blocks 122 and 142 can be reduced. As a result, the width of the integrated circuit package 100 in the bus direction is reduced, improving the space efficiency. The chip area which can be disposed on the bus increases. This makes it possible to implement the integrated circuit package 100 with a high density within the range of a limited bus length.

In this example, the distances between the pads 124-$i$ and the corresponding pins 128-$i$ are made substantially equal to one another for $i=1, 2, 3, \ldots, n$. Alternatively, the distances may be made equal for only the pins where the reduction of skewing is required. This is also applicable to the distances between the pads 144-$i$ and the pins 148-$i$. This alteration may also be made for the subsequent examples.

In Example 1, the pin arrays 128 and 148 are disposed on the sides of the chips 120 and 140, respectively, opposite to the sides adjacent to each other. Alternatively, the pin arrays 128 and 148 may be disposed on the sides thereof adjacent to each other if the following condition is satisfied. That is, the distances from the pins of the pin arrays 128 and 148 to another integrated circuit or the like via the bus 112 must be substantially equal to each other for the signal paths where the reduction of skewing is required. This alteration may also be made for the subsequent examples having a plurality of pin arrays.

In Example 1, the pins 128-$i$ are disposed on only one side of the chip 120. Alternatively, the pins 128-$i$, the wires 126-$i$, and the pads 124-$i$ may be disposed on a plurality of sides of the chip 120 if the following condition is satisfied. That is, the distances from the pins 128-$i$ to another integrated circuit or the like via the corresponding signal lines 112-$i$ must be substantially equal to one another for the signal paths where the reduction of skewing is required. This alteration may also be made for the subsequent examples.

In Example 1, the two chips have the same function. Alternatively, they may not have the same function.

EXAMPLE 2

Figure 3:
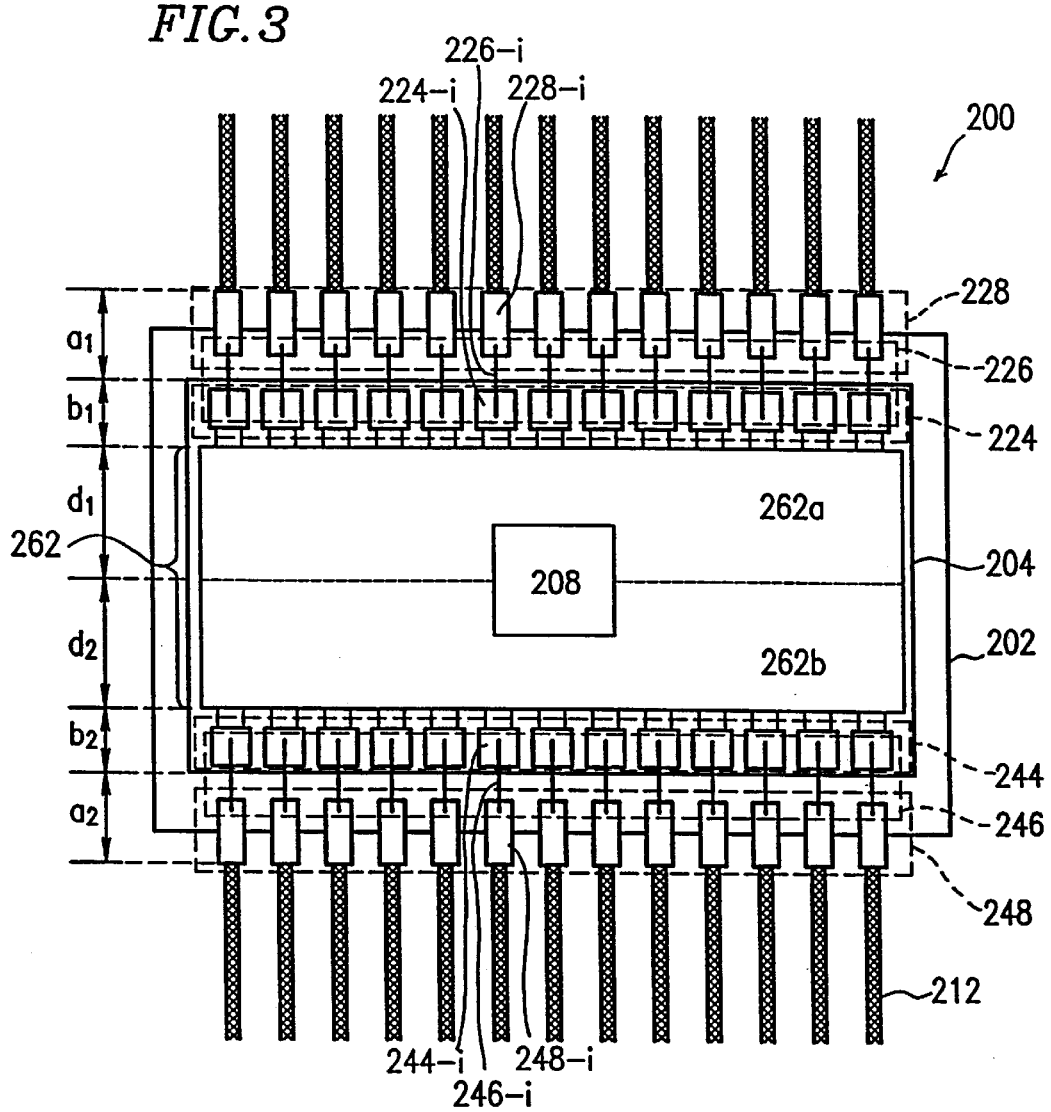
FIG. 3 is a plan view schematically illustrating the inner construction of an integrated circuit package of Example 2 according to the present invention.

An integrated circuit package of Example 2 according to the present invention will be described with reference to FIG. 3. In this example, only one chip constitutes the integrated circuit package, and a function block of the chip is divided into two function block portions.

The integrated circuit package 100 of Example 1 (FIG. 1) includes two chips 120 and 140 which have the function blocks 122 and 142, respectively. An integrated circuit package 200 of Example 2 is different from the integrated circuit package 100 (FIG. 1) in the following point. The integrated circuit package 200 includes a single chip 204 which has a function block 262. The function block 262 is divided into independent function block portions 262$a$ and 262$b$, which correspond to the function blocks 122 and 142 in Example 1.

As in the case of the function blocks 122 and 142, respective pads of the function block portions 262$a$ and 262$b$ which receive the same types of signals are disposed to be symmetrical to each other with respect to the boundary of the function block portions 262$a$ and 262$b$ in the state where they are oriented upward (i.e., they do not face a mold 202). The other components of the integrated circuit package 200 are substantially the same as those of the integrated circuit package 100 (FIG. 1).

In this example, with the above construction where the function block 262 composed of the independent function block portions 262$a$ and 262$b$ is formed on the chip 204, the dead spaces can be further reduced as compared with Example 1. In this example, as shown in FIG. 3, the area corresponding to the length $e_1'$ in the bus direction in FIG. 1 is eliminated from the dead spaces. Thus, in comparison with the conventional case shown in FIG. 18, the areas corresponding to the lengths $c_1$, $c_2$, and $e_1$ are eliminated from the dead spaces. The area obtained by the reduction of the dead spaces can be used for providing another integrated circuit. Thus, the chip area which can be disposed on the bus increases. This makes it possible to implement the integrated circuit package 200 with a high density within the range of a limited bus length.

Alternatively, the two independent function block portions 262$a$ and 262$b$ may share a circuit portion. Examples of such a common circuit 208 include a power source circuit (a booster circuit, a step-down circuit, etc.) and a synchronization circuit (a phase locked loop (PLL) circuit, a delay locked loop (DLL) circuit, etc.). By sharing a circuit, the length of the function block 262 ($d_1+d_2$) is reduced. As a result, the width of the integrated circuit package 200 in the bus direction is further reduced, improving the space efficiency. Thus, the chip area which can be disposed on the bus increases. This makes it possible to implement the integrated circuit package 200 with a high density within the range of a limited bus length.

EXAMPLE 3

An integrated circuit package of Example 3 according to the present invention will be described with reference to FIGS. 4 and 5. In this example, one of two chips having the same construction is placed face down with respect to the other chip.

The integrated circuit package 100 of Example 1 shown in FIG. 1 includes two chips 120 and 140 which have constructions different from each other. In other words, the respective pads of the chips 120 and 140 which receive the same types of signals are disposed so that they are symmetrical to each other with respect to the sides thereof adjacent to each other in the state where they are oriented upward (i.e., they do not face the mold 102). The chips 120 and 140 in Example 1 are therefore not the same in construction.

In this example, chips 720 and 740 having the same construction are used. By placing one of the chips 720 and 740 face down with respect to the other, the positions of pads of the chips 720 and 740 which receive the same types of signals can be made symmetrical to each other with respect to the sides of the chips 720 and 740 adjacent to each other due to the following reason.

Figure 4:
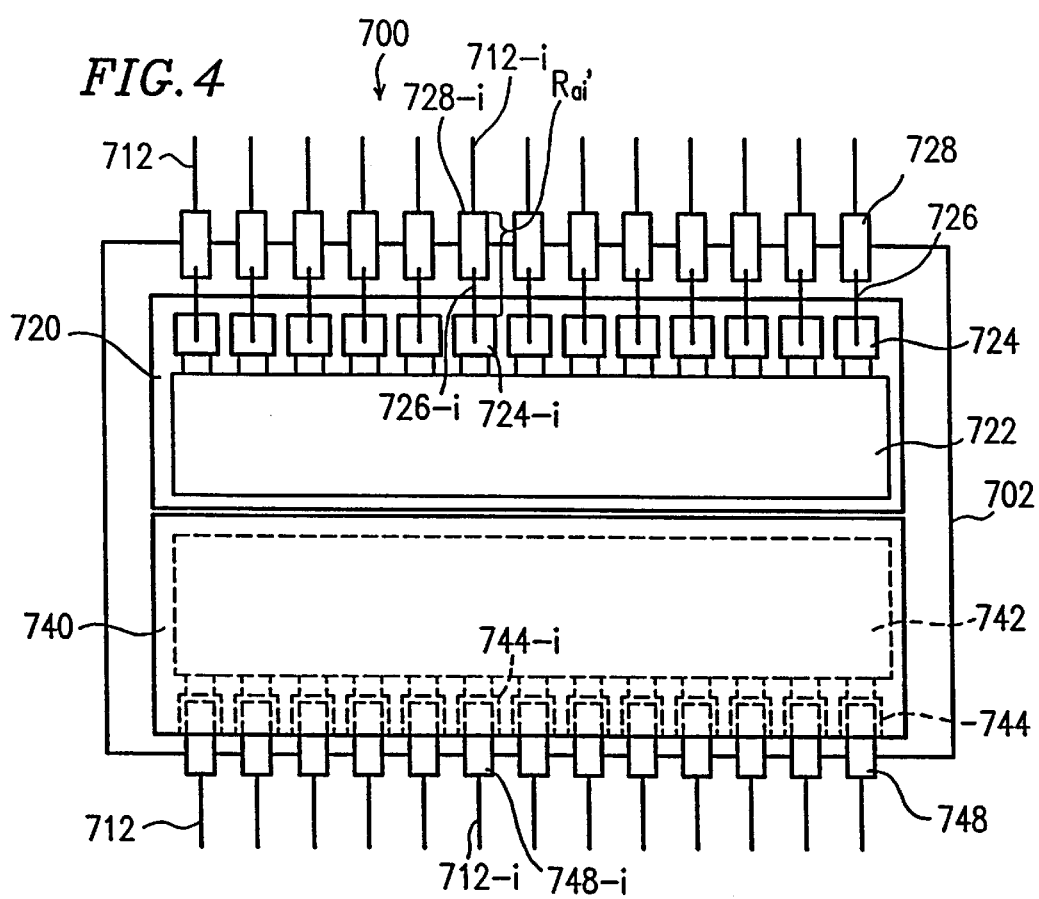
FIG. 4 is a plan view schematically illustrating the inner construction of an integrated circuit package of Example 3 according to the present invention.

Referring to FIG. 4, an integrated circuit package 700 of this example includes the chips 720 and 740 disposed on a mold 702. The chip 720 has substantially the same construction as the chip 120 in Example 1. In this example, the chip 740 has the same function and construction as the chip 720.

Figure 5:
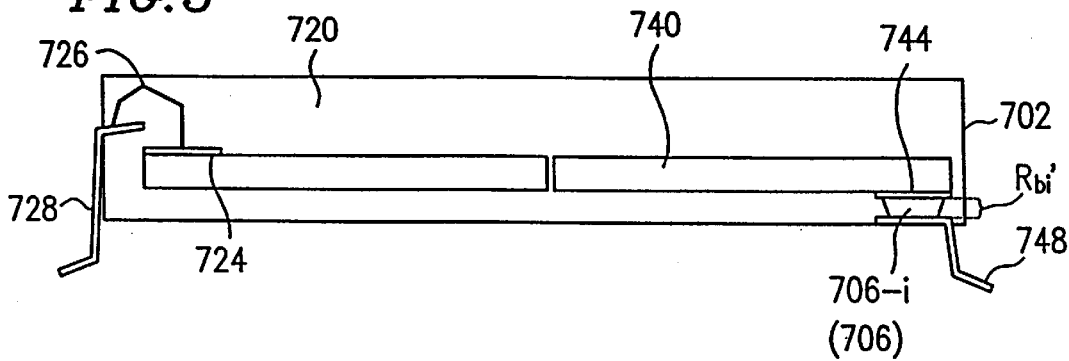
FIG. 5 is a side view schematically illustrating the integrated circuit package of Example 3.

FIG. 5 is a sectional view of the integrated circuit package 700 shown in FIG. 4.

In the integrated circuit package 700 of this example, the chip 720 is disposed on the mold 702 so that pads 724-$i$ of a pad array 724 do not face the mold 702. On the contrary, the chip 740 is placed face down with respect to the chip 720. That is, the chip 740 is disposed so that pads 744-$i$ of a pad array 744 face the mold 702.

A function block 722 of the chip 720 is connected to signal lines 712-$i$ ($1 \leq i \leq n$) of a bus 712 via the pads 724-$i$ of the pad array 724, wires 726-$i$ of a wire array 726, and pins 728-$i$ of a pin array 728.

A function block 742 of the chip 740 is connected to the pads 744-$i$ ($1 \leq i \leq n$) of the pad array 744 at predetermined positions thereof. The pads 744-$i$ are connected to pins 748-$i$ of a pin array 748 via corresponding bumps 706-$i$ of a bump array 706. The pins 748-$i$ are connected to the signal lines 712-$i$ of the bus 712.

The other components of the integrated circuit package 700 are substantially the same as those of the integrated circuit package 100 (FIG. 1).

In this example, where the chip 740 is placed face down, the same effect as that described in Example 1 can be obtained by appropriately adjusting the thickness of the bumps 706-$i$, the length of the pins 728-$i$ and 748-$i$, and the length of the wires 726-$i$.

Accordingly, in this example, as in the previous examples, the distances $R_{a1}'$ from the pads 724-$i$ connected to the function block 722 at predetermined positions to the signal lines 712-$i$ of the bus 712 via the corresponding pins 728-$i$ can be made substantially uniform for i=1, 2, ..., n. Likewise, the distances $R_{b1}'$ from the pads 744-$i$ connected to the function block 742 at predetermined positions to the signal lines 712-$i$ of the bus 712 via the corresponding bumps 706-$i$ and the pins 748-$i$ can be made substantially uniform. Moreover, the distances $R_{a1}'$ and $R_{b1}'$ may be made equal to each other. In this example, therefore, all the advantages such as the reduction of skewing and the reduction of the dead spaces described in relation with Example 1 can be obtained.

In addition, since the chips 720 and 740 have the same construction, the cost for chip fabrication can be reduced compared with the case of Example 1.

EXAMPLE 4

An integrated circuit package of Example 4 according to the present invention will be described with reference to FIGS. 6 and 7. In this example, two chips of the integrated circuit package are disposed to overlap each other.

An integrated circuit package 300 of this example includes chips 320 and 340 on a mold 302. The chips 320 and 340 have function blocks 322 and 342, respectively, which have predetermined independent functions.

The integrated circuit package 300 of this example is different from the integrated circuit package 100 of Example 1 (FIG. 1) in the following point. While the chips 120 and 140 in Example 1 are disposed side by side, the chips 320 and 340 in this example are disposed to overlap each other via a spacer 301. Pads 324-$i$ are connected to corresponding pins 328-$i$ via wires 326-$i$. Likewise, pads 344-$i$ are connected to corresponding pins 348-$i$ via wires 346-$i$. A portion above a pad array 324 is left vacant in order to secure a space for the connection. The other components of the integrated circuit package 300 are the same as those of the integrated circuit package 100 (FIG. 1).

Figure 6:
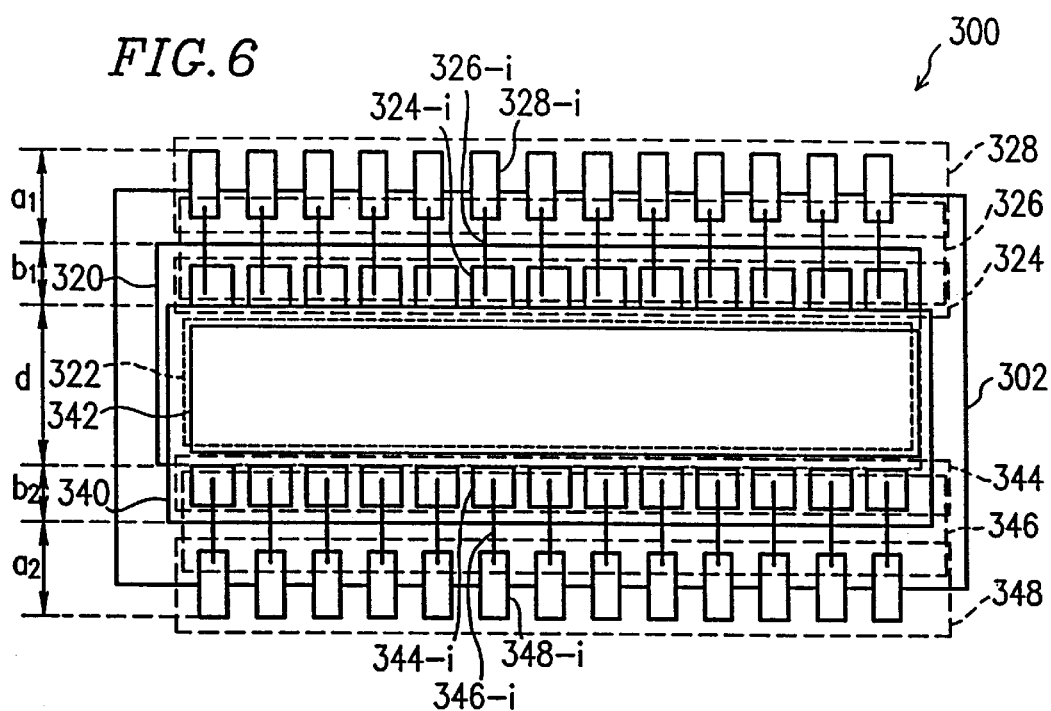
FIG. 6 is a plan view schematically illustrating the inner construction of an integrated circuit package of Example 4 according to the present invention.
Figure 7:
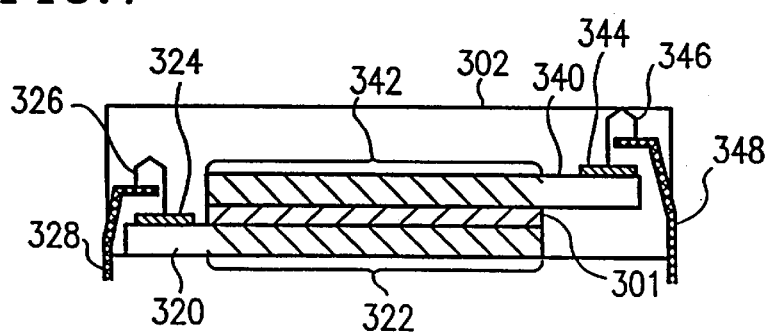
FIG. 7 is a side view schematically illustrating the inner construction of an integrated circuit package of Example 4.

In the construction shown in FIG. 6, the areas corresponding to lengths $a_1$, $b_1$, $a_2$, $b_2$ constitute dead spaces. In comparison with the conventional case shown in FIG. 18, the areas corresponding to the lengths $c_1$, $c_2$, and $e_1$ are eliminated from the dead spaces. Moreover, the length d of the function blocks 322 and 342 in the bus direction is markedly reduced from ($d_1+d_2$) to a half thereof, i.e., ($d_1+d_2$)/2, reducing the dead spaces by the area corresponding to the reduction of the length. The area obtained by the reduction of the dead spaces can be used for providing another integrated circuit. Thus, the chip area which can be disposed on the bus increases. This makes it possible to implement the integrated circuit package 300 with a high density within the range of a limited bus length.

In this example, as in the previous examples, a circuit which can be shared by the chips 320 and 340 may be disposed on the chip 320 or 340. Such a common circuit may be used by providing connection pads on the chips 320 and 340 and connecting them with a wire. This construction serves to further reduce the length d of the function blocks 322 and 342 in the bus direction, improving the space efficiency. Thus, the chip area which can be disposed on the bus increases. This makes it possible to implement the integrated circuit package 300 with a high density within the range of a limited bus length.

In the integrated circuit package 300, since a step exists between the chips 320 and 340, the distance between the pad array 324 and the bus 312 is different from the distance between a pad array 344 and the bus 312. This difference can be eliminated by appropriately adjusting the length of the wires or the arrangement of the pins.

EXAMPLE 5

In Example 5, an integrated circuit package control system according to the present invention will be described with reference to FIG. 8. The integrated circuit package control system of this example includes an integrated circuit package according to the present invention and a control section for controlling the integrated circuit package.

An integrated circuit package control system 850 of this example includes m integrated circuit packages 800-$j$ ($1 \leq j \leq m$; j and m are integers) and a control circuit 810 for controlling the integrated circuit packages 800-$j$. The control circuit 810 and the integrated circuit packages 800-$j$ are connected to a common bus 812. The control circuit 810 is also connected to another integrated circuit such as a CPU (not shown) of a computer.

In this example, each of the integrated circuit packages 800-$j$ may be any of the integrated circuit packages of Examples 1 to 4 described above or any of integrated circuit packages of Examples 6 to 8 to be descried hereinbelow. Chips constituting each integrated circuit package may be integrated circuit chips of any type.

In this example, the integrated circuit packages 800-$j$ are assumed to be any of the integrated circuit packages 100 (FIG. 1), 200 (FIG. 3), 300 (FIG. 6), and 700 (FIG. 4) described in Examples 1 to 4 above. The chips constituting each of the integrated circuit packages 800-$j$ are assumed to be memory chips.

The control circuit 810 includes a plurality of terminals used for input/output of signals, power supply, and the like. The plurality of terminals include, for example, terminals for power supply and grounding, and terminals for inputting/outputting a command signal, a clock signal, a bus control signal, a bus enable signal, and a data signal. The control circuit 810 in this example can be an integrated circuit generally known as a memory controller. The detailed construction thereof is therefore omitted here.

Since the integrated circuit packages of any of Examples 1 to 4 are used in this example, the effects described in Examples 1 to 4 can be obtained. In other words, an integrated circuit package control system which has a smaller dead space than a conventional integrated circuit control package system can be obtained.

Advantages of the integrated circuit package control system of this example will be specifically described.

Figure 8:
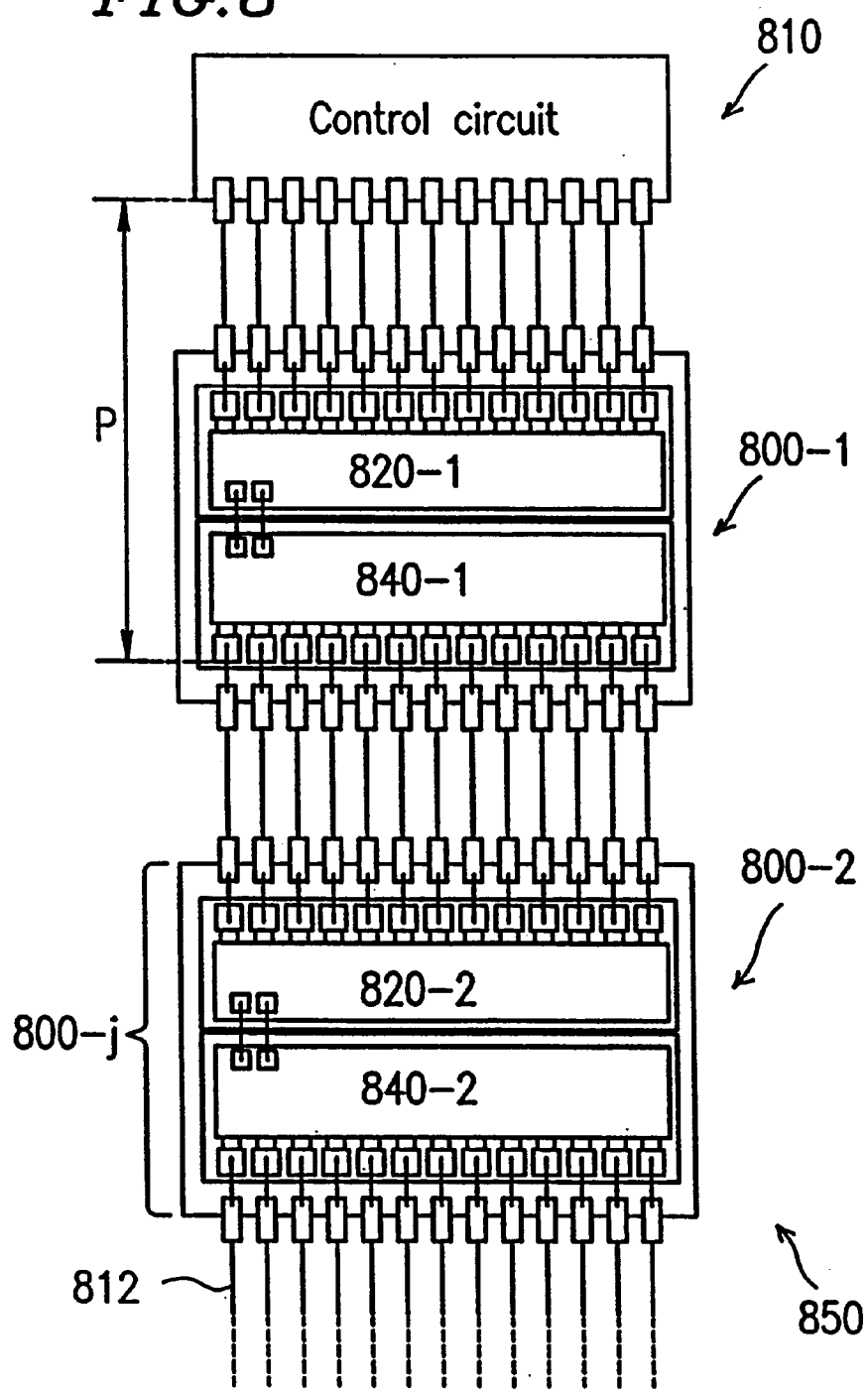
FIG. 8 is a plan view schematically illustrating the construction of an integrated circuit package control system of Example 5 according to the present invention.
Figure 19:
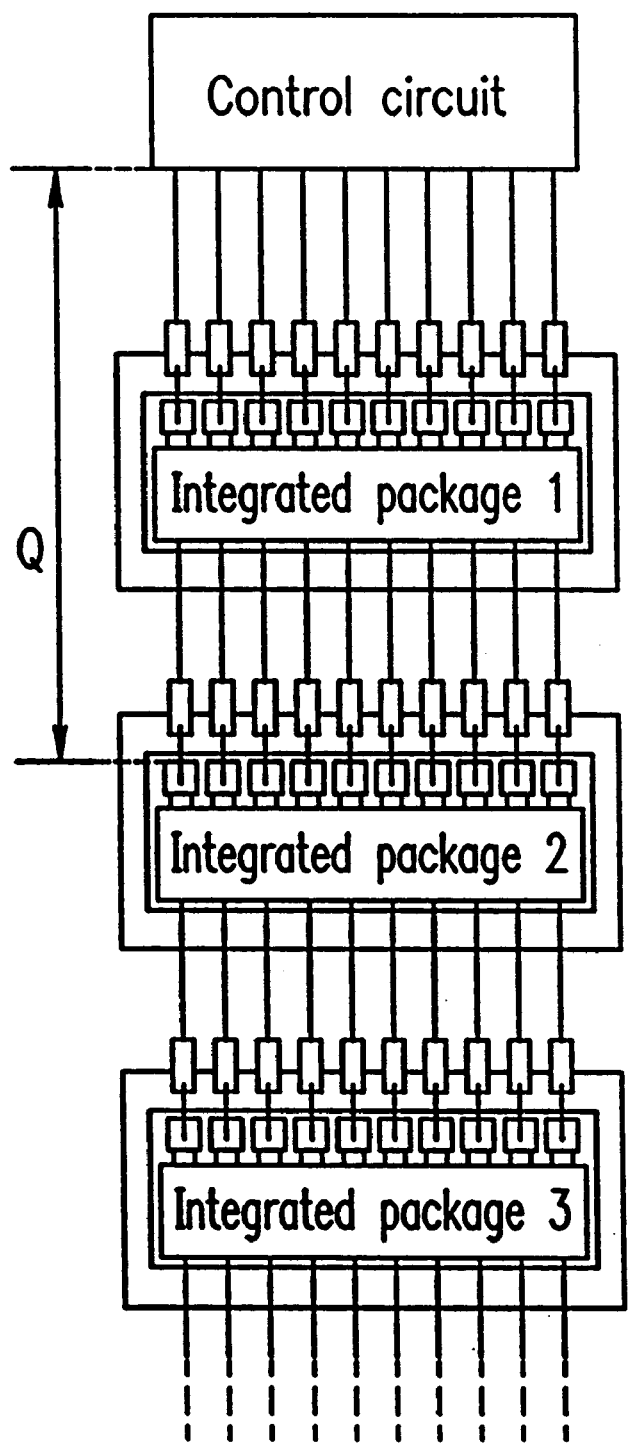
FIG. 19 is a plan view schematically illustrating the construction of a conventional integrated circuit package control system.

In comparison with a conventional integrated circuit package control system shown in FIG. 19, a wiring distance P from the terminals of the control circuit 810 to corresponding pads of a memory chip 840-1 constituting an integrated circuit package 800-1 shown in FIG. 8 is shorter than a wiring distance Q from a control circuit to pads of a chip constituting an integrated circuit package 2 of the conventional integrated circuit package control system of FIG. 19, i.e., P<Q. As a result, the bus length from the control circuit 810 to each of the integrated circuit packages 800-$j$ can be reduced. Alternatively, the integrated circuit chips can be arranged with a higher density within the range of a limited bus length.

In this example, any of the integrated circuit packages of Examples 1 to 4 can be used as described above. Accordingly, at the construction of the system of this example, it is possible to select whether the two memory chips constituting each of the integrated circuit packages should be arranged side by side, overlapping each other, or placing one of them face down with respect to the other, as required.

EXAMPLE 6

An integrated circuit package of Example 6 according to the present invention will be described with reference to FIGS. 9 and 10. In this example, pad arrays of two chips of the integrated circuit package are disposed on the sides of the chips adjacent to each other, and a pin array is shared by the two chips.

Figure 9:
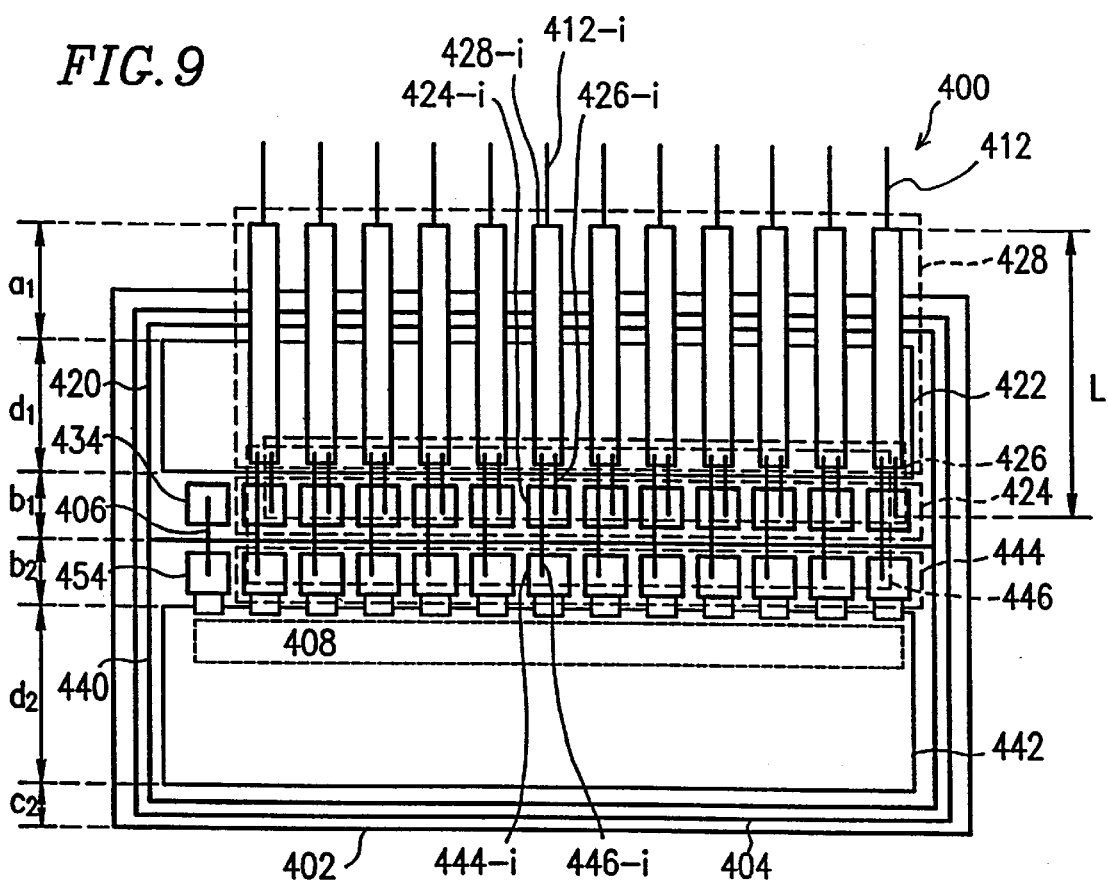
FIG. 9 is a plan view schematically illustrating the inner construction of an integrated circuit package of Example 6 according to the present invention.
Figure 10:
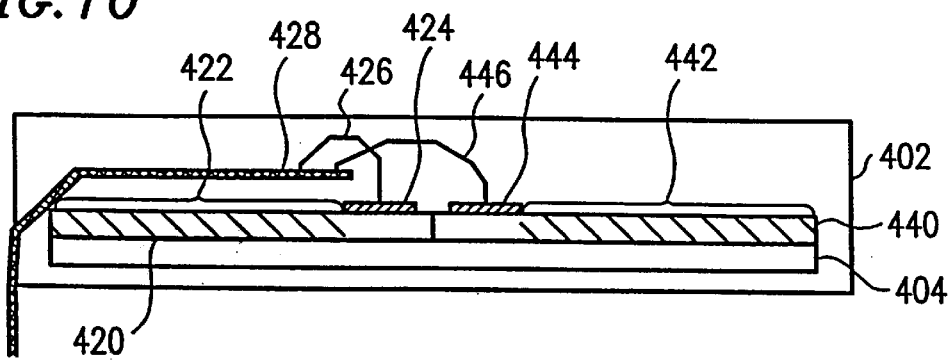
FIG. 10 is a side view schematically illustrating the inner construction of the integrated circuit package of Example 6.

FIGS. 9 and 10 are plan and side views, respectively, of an integrated circuit package 400 of this example according to the present invention.

The integrated circuit package 400 includes a substrate 404 formed on a mold 402. Two chips 420 and 440 are disposed side by side on the substrate 404. The chips 420 and 440 respectively include independent function blocks 422 and 442 on the sides thereof opposite to the sides adjacent to each other.

The chip 420 has a pad array 424 on the side thereof adjacent to the chip 440. The pad array 424 includes a plurality of pads 424-$i$ ($1 \leq i \leq n$) arranged substantially linearly. Each of the pads 424-$i$ is connected to the function block 422 at a predetermined position. The chip 440 has a pad array 444 on the side thereof adjacent to the chip 420. The pad array 444 includes a plurality of pads 444-$i$ ($1 \leq i \leq n$) arranged substantially linearly. Each of the pads 444-$i$ is connected to the function block 442 at a predetermined position.

As shown in FIG. 10, a pin array 428 is disposed above the chip 420 of the integrated circuit package 400. The pin array 428 includes a plurality of pins 428-$i$ ($1 \leq i \leq n$). The pins 428-$i$ are connected to the corresponding pads 424-$i$ via wires 426-$i$, and also connected to the corresponding pads 444-$i$ via wires 446-$i$ for i=1, 2, . . . , n. The distances between the pads 424-$i$ and the corresponding pins 428-$i$ are substantially equal to one another for i=1, 2, . . . , n. The distances between the pads 444-$i$ and the corresponding pins 428-$i$ are substantially equal to one another for i=1, 2, . . . , n.

In the integrated circuit package 400, the distances $L_i$ ($1 \leq i \leq n$) from the pads 424-$i$ to signal lines 412-$i$ of a bus 412 via the corresponding pins 428-$i$ are substantially equal to one another for i=1, 2, . . . , n. Thus, the reduction of skewing is possible.

The integrated circuit package 400 of this example is characterized in that the two function blocks 422 and 442 are connected to the bus 412 via the common pin array 428. This can be realized by using the pins 428-$i$ of a lead on chip (LOC) structure. As shown in FIG. 9, the areas corresponding to lengths $a_1$, $b_1$, $b_2$, and $c_2$ in the bus direction constitute dead spaces. In comparison with the conventional case shown in FIG. 18, the areas corresponding to the lengths $c_1$, $e_1$, and $a_2$ are eliminated from the dead spaces. The area obtained by the reduction of the dead spaces can be used for providing another integrated circuit. Thus, the chip area which can be disposed on the bus increases. This makes it possible to implement the integrated circuit package 400 with a high density within the range of a limited bus length.

Alternatively, pads 434 and 454 formed on the function blocks 422 and 442, respectively, may be connected to each other by a wire 406, to allow a circuit portion 408 to be shared by the chips 420 and 440. Examples of such a common circuit 408 include a power source circuit (a booster circuit, a step-down circuit, etc.) and a synchronization circuit (a phase locked loop (PLL) circuit, a delay locked loop (DLL) circuit, etc.). With this alternative construction, the lengths $d_1$ and $d_2$ of the function blocks 422 and 442 can be reduced. As a result, the width of the integrated circuit package 400 in the bus direction is further reduced, improving the space efficiency. The chip area which can be disposed on the bus increases. This makes it possible to implement the integrated circuit package 400 with a high density within the range of a limited bus length.

EXAMPLE 7

An integrated circuit package of Example 7 according to the present invention will be described with reference to FIGS. 11 and 12.

An integrated circuit package 500 of this example does not include the construction corresponding to the pad array 444 and the wire array 446 of the integrated circuit package 400 of Example 6 (FIG. 9). Instead, function blocks 522 and 542 are commonly connected to a pad array 524. Pads 524-$i$ of the pad array 524 are connected to corresponding pins 528-$i$ via wires 526-$i$. As shown in FIG. 12, the pin array 528 is disposed above the function block 522. The connection of the function blocks 522 and 542 to the same pin array 528 means that the pins connected to the function block 522 and the pins connected to the function block 542 have the same length. This corresponds to the fact that the pins 128-$i$ and 148-$i$ in Example 1 shown in FIG. 1, for example, have the same length. The other components of the integrated circuit package 500 are the same as those of the integrated circuit package 400 (FIG. 9). In this example, as in Example 6, the reduction of skewing is realized.

Figure 11:
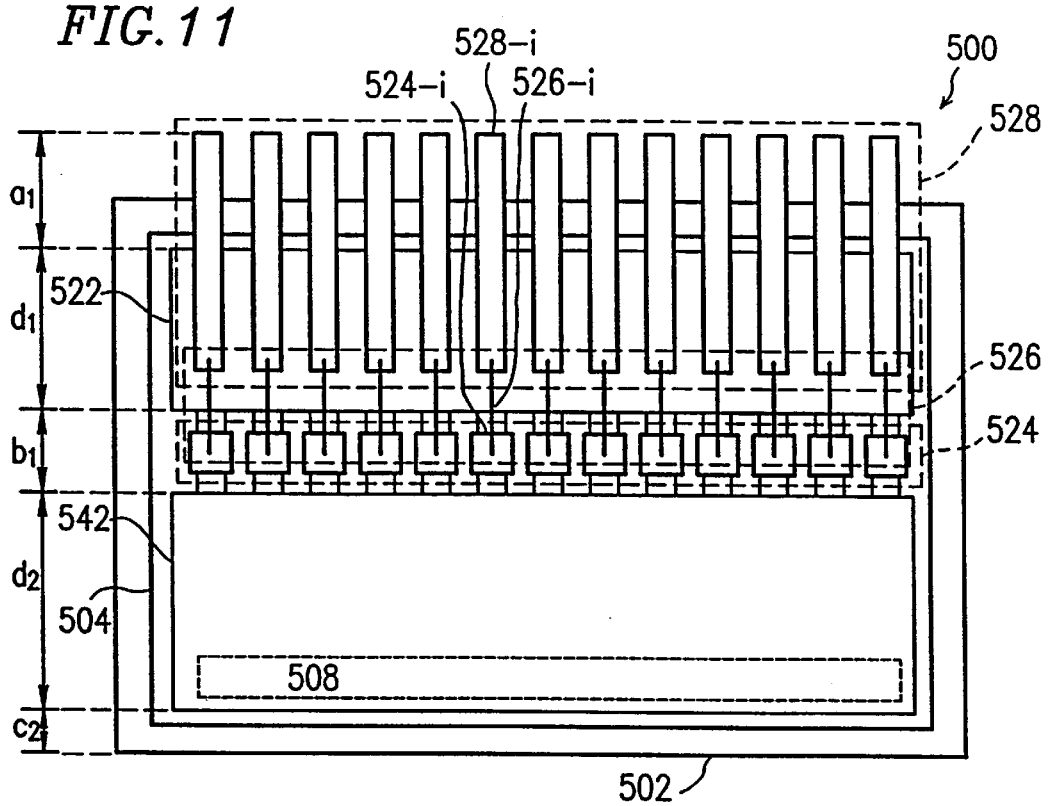
FIG. 11 is a plan view schematically illustrating the inner construction of an integrated circuit package of Example 7 according to the present invention.
Figure 12:
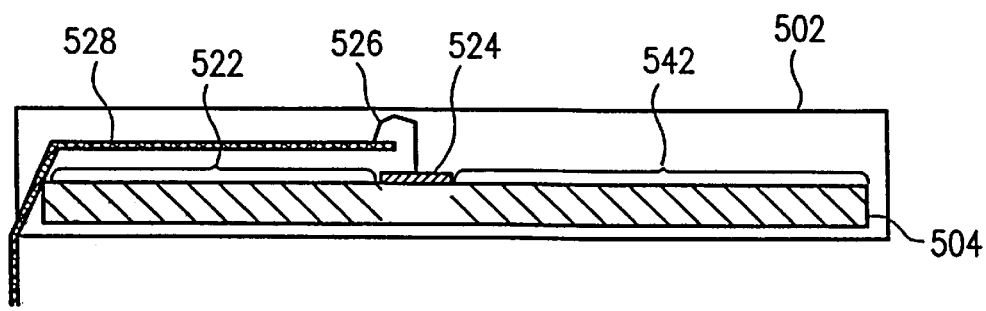
FIG. 12 is a side view schematically illustrating the inner construction of an integrated circuit package of Example 7.

As shown in FIG. 11, the areas corresponding to lengths $a_1$, $b_1$, and $c_2$ constitute dead spaces. In comparison with the conventional case shown in FIG. 18, the areas corresponding to the lengths $c_1$, $e_1$, $a_2$, and $b_2$ are eliminated from the dead spaces. The area obtained by the reduction of the dead spaces can be used for providing another integrated circuit. Thus, the chip area which can be disposed on the bus increases. This makes it possible to implement the integrated circuit package 500 with a high density within the range of a limited bus length.

EXAMPLE 8

An integrated circuit package of Example 8 according to the present invention will be described with reference to FIGS. 13, 14, and 15. In this example, one of two chips constituting the integrated circuit package completely overlaps the other.

Figure 13:
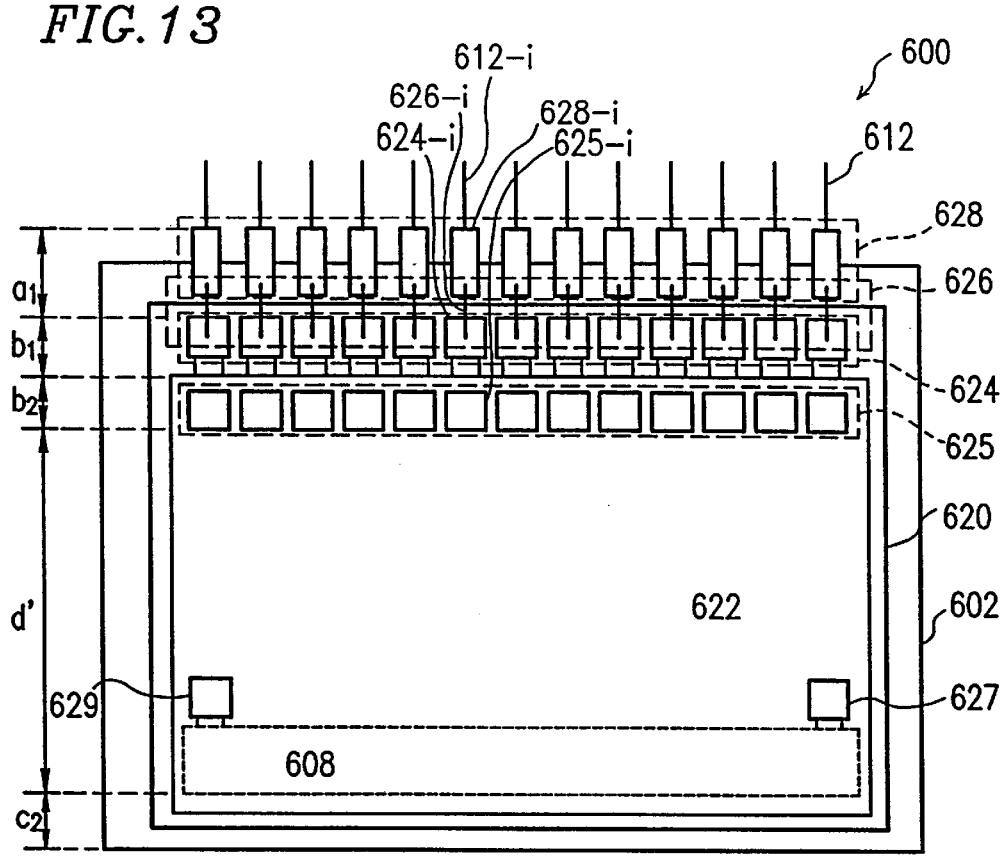
FIG. 13 is a plan view schematically illustrating the inner construction of an integrated circuit package of Example 8 according to the present invention.
Figure 14:
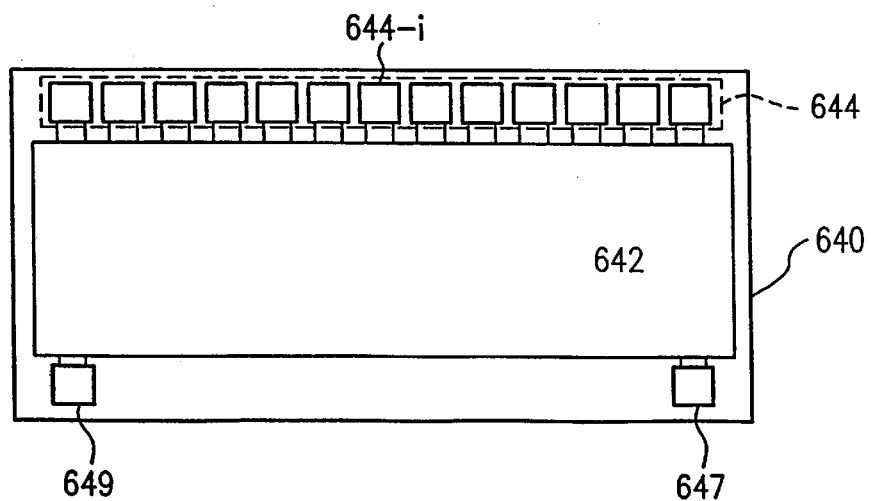
FIG. 14 is a partial plan view schematically illustrating the inner construction of an integrated circuit package of Example 8.
Figure 15:
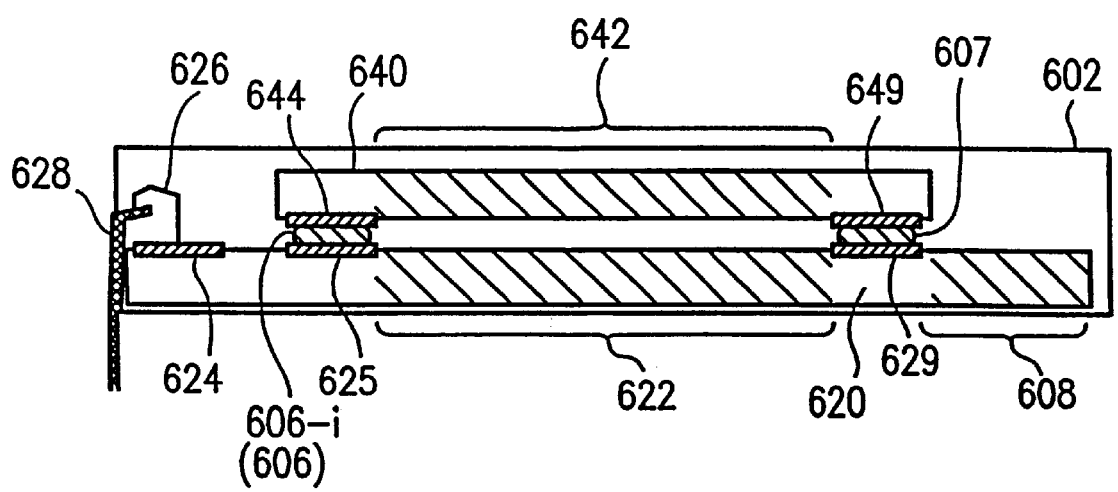
FIG. 15 is a side view schematically illustrating the inner construction of an integrated circuit package of Example 8.
Figure 16A:
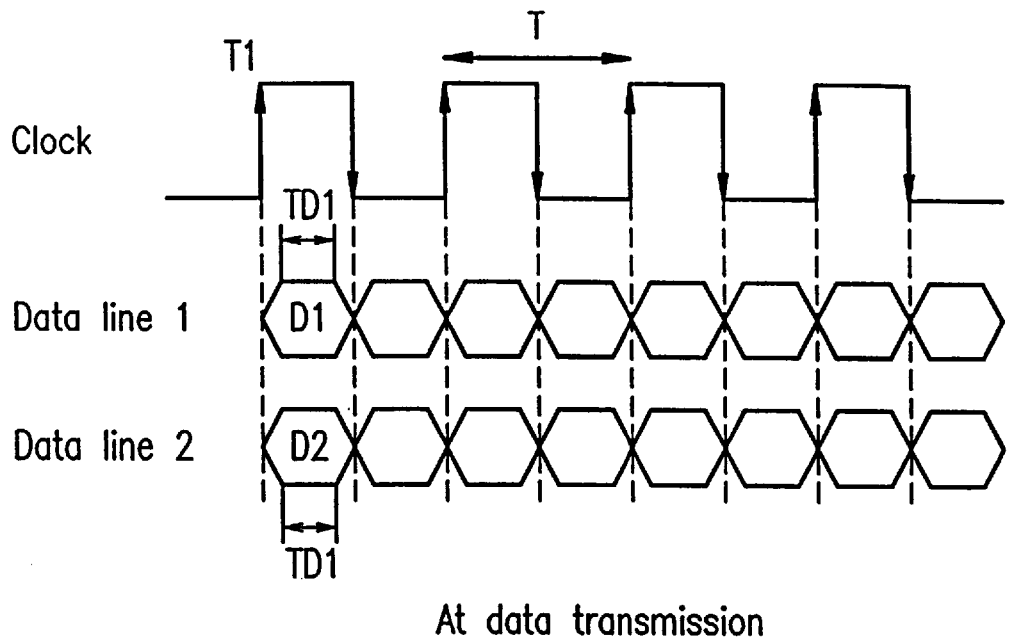
FIGS. 16A and 16B are views illustrating timings at data transmission and data receiving, respectively, in the data transfer between LSIs disposed on a bus formed on a printed board.
Figure 16B:
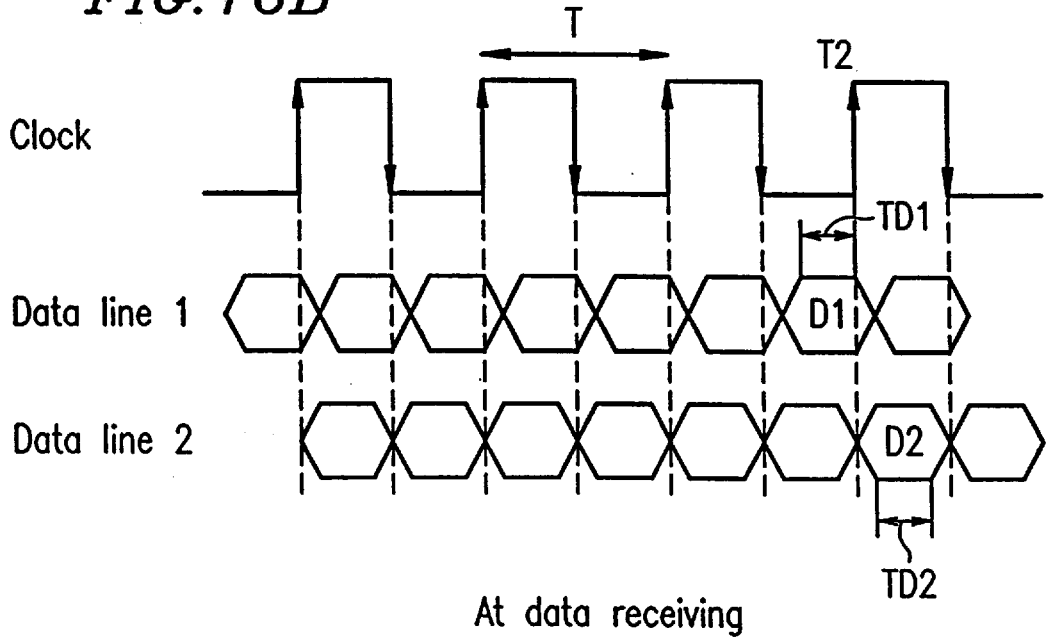
Figure 17:
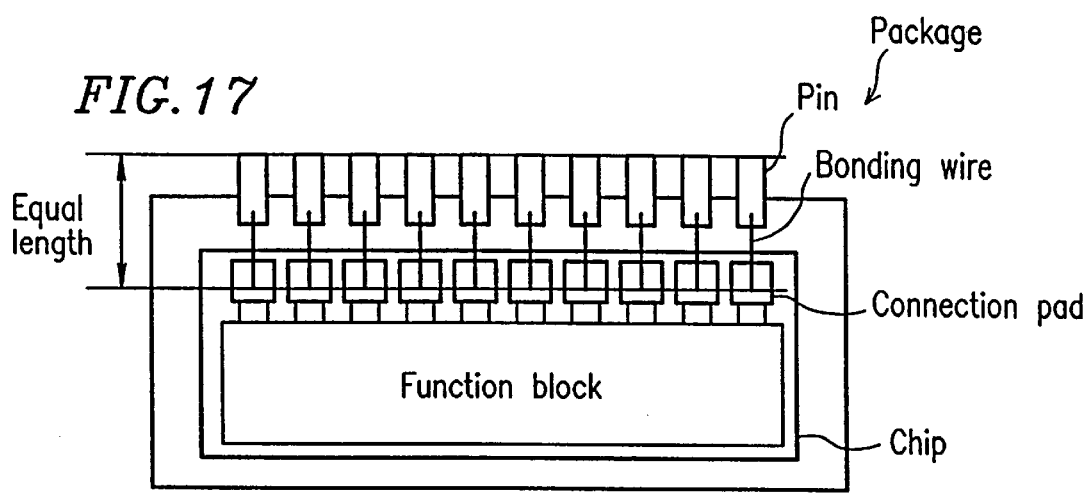
FIG. 17 is a plan view illustrating the inner construction of a conventional integrated circuit package.

FIGS. 13 and 14 are plan views of an integrated circuit package 600 of this example according to the present invention, and FIG. 15 is a side view thereof.

The integrated circuit package 600 includes chips 620 and 640 disposed on a mold 602. The chips 620 and 640 respectively include independent function blocks 622 and 642. The chip 640 entirely overlaps the chip 620 as shown in FIG. 15.

The chip 620 has a pad array 624 disposed on one side thereof. The pad array 624 includes a plurality of pads 624-$i$ ($1 \leq i \leq n$) arranged substantially linearly. A function block 622 has a pad array 625 which includes a plurality of pads 625-$i$ ($1 \leq i \leq n$) arranged substantially linearly. The pad array 625 is disposed so as to be adjacent to and substantially in parallel with the pad array 624. The pads 625-$i$ are connected to the function block 622 at predetermined positions, and also connected to the corresponding pads 624-$i$. A pin array 628 is disposed on one side of the mold 602. The pad array 624 and the pin array 628 are adjacent to and substantially in parallel with each other. The pads 624-$i$ are connected to corresponding pins 628-$i$ via wires 626-$i$.

The chip 640 has a pad array 644 disposed on one side thereof. The pad array 644 includes a plurality of pads 644-$i$ ($1 \leq i \leq n$) arranged substantially linearly. The pads 644-$i$ are connected to the function block 642 at predetermined positions. The pads 644-$i$ are also connected to the corresponding pads 625-$i$ of the chip 620 via bumps 606-$i$ of a bump array 606.

The bumps 606-$i$ may be made of a solder or gold. Gold is more preferable. The size of each of the bumps 606 is preferably about 100 $\mu$m×about 100 $\mu$m with a height of about 100 to about 60 $\mu$m. The above material and size for the bumps are applicable to all the wires used in the integrated circuit packages according to the present invention.

Thus, in the integrated circuit package 600, the pads 625-$i$ are connected to corresponding signal lines 612-$i$ of a bus 612 via the pads 624-$i$, the wires 626-$i$, and the pins 628-$i$. The distances from the pads 624-$i$ to the corresponding pins 628-$i$ are substantially equal to one another for i=1, 2, . . . , n. Likewise, the pads 644-$i$ are connected to the signal lines 612-$i$ via the pads 625-$i$, the pads 624-$i$, the wires 626-$i$, and the pins 628-$i$. The distances from the pads 644-$i$ to the corresponding pins 628-$i$ are substantially equal to one another for i=1, 2, . . . , n. With this arrangement, skewing between data clocks can be reduced.

As shown in FIG. 13, the areas corresponding to lengths $a_1$, $b_1$, $b_2$, and $c_2$ constitute dead spaces. In comparison with the conventional case shown in FIG. 18, the areas corresponding to the lengths $c_1$, $e_1$, and $a_2$ are eliminated from the dead spaces. Moreover, the length d'of the function blocks 622 and 642 in the bus direction is reduced from the sum of the lengths thereof, reducing the dead spaces by the area corresponding to the reduction of the length. The area obtained by the reduction of the dead spaces can be used for providing another integrated circuit. Thus, the chip area which can be disposed on the bus increases. This makes it possible to implement the integrated circuit package 600 with a high density within the range of a limited bus length.

It is also possible to connect pads 627 and 629 disposed on the function block 622 to pads 647 and 649 disposed on the function block 642 via bumps 605 and 607, respectively, to allow a circuit portion 608 to be shared by the chips 620 and 640. Examples of such a common circuit 608 include a power source circuit (a booster circuit, a step-down circuit, etc.) and a synchronization circuit (a phase locked loop (PLL) circuit, a delay locked loop (DLL) circuit, etc.). With this alternative construction, the length d' of the function blocks 622 and 642 can be reduced. As a result, the width of the integrated circuit package 600 in the bus direction is reduced, improving the space efficiency. Thus, the chip area which can be disposed on the bus increases. This makes it possible to implement the integrated circuit package 600 with a high density within the range of a limited bus length.

Thus, according to the present invention, skewing between data clocks can be prevented. Also, in the integrated circuit package according to the present invention, the dead space as an area corresponding to a length in the bus direction can be reduced. The area obtained by the reduction of the dead space can be used for arrangement of another integrated circuit. This increases the chip area which can be disposed on the bus of which length is limited to avoid disturbance of transfer data and a clock waveform due to noise and the like.

A portion of a circuit can be shared by a plurality of function blocks. This further improves the space efficiency, and increases the chip area which can be disposed on the bus of a limited length. Reduction of power consumption is also possible by sharing a circuit portion.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An integrated circuit package mounted in a substantially parallel plane with respect to a surface of a substrate comprising a first integrated circuit chip and a second integrated circuit chip having a same function, wherein the first integrated circuit chip and the second integrated circuit chip are connected to a common bus, the integrated circuit package further comprising:

a plurality of pins connected to the common bus, and a plurality of pads respectively connected to the plurality of pins, wherein the plurality of pins includes first pins corresponding to the first integrated circuit chip, the plurality of pads includes first pads corresponding to the first integrated circuit chip, each distance between a first point at which each one of the first pins is connected to the common bus and a second point at which each one of the first pins is respectively connected to each one of the first pads is substantially equal to each other such distance, and the plurality of pins are disposed so as to reduce dead spaces of the integrated circuit package.

2. An integrated circuit package according to claim 1, wherein the first integrated circuit chip and the second integrated circuit chip are memory chips.

3. An integrated circuit package according to claim 1, wherein the first integrated circuit chip and the second integrated circuit chip are disposed so that the first integrated circuit chip and the second integrated circuit chip are adjacent to each other in a plane.

4. An integrated circuit package according to claim 1, wherein the first integrated circuit chip and the second integrated circuit chip are disposed so that the first integrated circuit chip and the second integrated circuit chip overlap each other.

5. An integrated circuit package according to claim 1, wherein the first integrated circuit chip and the second integrated circuit chip are disposed so that one of the first integrated circuit chip and the second integrated circuit chip is placed face down with respect to the other.

6. A system comprising an integrated circuit package mounted in a substantially parallel plane with respect to a surface of a substrate and a control circuit for controlling the integrated circuit package,
- wherein the integrated circuit package includes a first integrated circuit chip and a second integrated circuit chip having a same function; and
- the first integrated circuit chip, the second integrated circuit chip, and the control circuit are connected to a common bus,
- the integrated circuit package further comprising:
  - a plurality of pins connected to the common bus, and
  - a plurality of pads respectively connected to the plurality of pins,
  - wherein the plurality of pins includes first pins corresponding to the first integrated circuit chip,
  - the plurality of pads includes first pads corresponding to the first integrated circuit chip,
  - each distance between a first point at which each one of the first pins is connected to the common bus and a second point at which each one of the first pins is respectively connected to each one of the first pads is substantially equal to each other such distance, and
  - the plurality of pins are disposed so as to reduce dead spaces of the integrated circuit package.

7. A system according to claim 6, wherein the first integrated circuit chip and the second integrated circuit chip are memory chips.

8. A system according to claim 6, wherein the first integrated circuit chip and the second integrated circuit chip are disposed so that the first integrated circuit chip and the second integrated circuit chip are adjacent to each other in a plane.

9. A system according to claim 6, wherein the first integrated circuit chip and the second integrated circuit chip are disposed so that the first integrated circuit chip and the second integrated circuit chip overlap each other.

10. A system according to claim 6, wherein the first integrated circuit chip and the second integrated circuit chip are disposed so that one of the first integrated circuit chip and the second integrated circuit chip is placed face down with respect to the other.

11. An integrated circuit package according to claim 1, the plurality of pins comprising:
- a first pin array corresponding to the first integrated circuit chip, and
- a second pin array corresponding to the second integrated circuit chip,
- wherein the first pin array and the second pin array are disposed on different sides of the integrated circuit package.

12. An integrated circuit package according to claim 1,
- the plurality of pins correspond to both the first integrated circuit chip and the second integrated circuit chip,
- wherein the plurality of pins are disposed on only one side of the integrated circuit package.

* * * * *